United States Patent
Yang et al.

(10) Patent No.: US 9,955,090 B2
(45) Date of Patent: Apr. 24, 2018

(54) HIGH DYNAMIC RANGE IMAGE SENSOR WITH VIRTUAL HIGH-LOW SENSITIVITY PIXELS

(71) Applicant: OMNIVISION TECHNOLOGIES, INC., Santa Clara, CA (US)

(72) Inventors: Dajiang Yang, San Jose, CA (US); Gang Chen, San Jose, CA (US); Oray Orkun Cellek, Santa Cruz, CA (US); Xin Wang, San Jose, CA (US); Chen-Wei Lu, San Jose, CA (US); Duli Mao, Sunnyvale, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/215,139

(22) Filed: Jul. 20, 2016

(65) Prior Publication Data

US 2018/0027196 A1   Jan. 25, 2018

(51) Int. Cl.
*H04N 5/355* (2011.01)
*H04N 9/04* (2006.01)
(Continued)

(52) U.S. Cl.
CPC ... *H04N 5/35563* (2013.01); *H01L 27/14609* (2013.01); *H01L 27/14621* (2013.01);
(Continued)

(58) Field of Classification Search
CPC .... H04N 5/35563; H04N 9/045; H04N 5/378; H01L 27/14609; H01L 27/14621; H01L 27/14627; H01L 27/14643
See application file for complete search history.

(56) References Cited

U.S. PATENT DOCUMENTS

| 3,971,065 A | 7/1976 | Bayer |
| 2005/0103983 A1* | 5/2005 | Yamaguchi ....... H01L 27/14621 250/214.1 |

(Continued)

OTHER PUBLICATIONS

U.S. Appl. No. 14/743,385—Final Office Action, dated Jan. 18, 2017, 16 pages.
(Continued)

*Primary Examiner* — Albert Cutler
(74) *Attorney, Agent, or Firm* — Christensen O'Connor; Johnson Kindness PLLC

(57) ABSTRACT

An image sensor includes a plurality of photodetectors that are identically sized and fabricated in semiconductor material with identical semiconductor processing conditions. The photodetectors are organized into virtual high-low sensitivity groupings, each including a first photodetector and a second photodetector. A plurality of attenuators is disposed over the semiconductor material. Each one of the plurality of attenuators is disposed along an optical path between a microlens and the first photodetector of each virtual high-low sensitivity grouping such that all incident light directed into the first photodetector is directed through a respective one of the plurality of attenuators. There is no attenuator along a second optical path between a microlens and the second photodetector of each virtual high-low sensitivity grouping such that all the incident light directed into the second photodetector is not directed through one of the plurality of attenuators.

16 Claims, 5 Drawing Sheets

(51) Int. Cl.
*H04N 5/378* (2011.01)
*H01L 27/146* (2006.01)
(52) U.S. Cl.
CPC .. *H01L 27/14627* (2013.01); *H01L 27/14643* (2013.01); *H04N 5/378* (2013.01); *H04N 9/045* (2013.01)

(56) References Cited

U.S. PATENT DOCUMENTS

| | | | | |
|---|---|---|---|---|
| 2007/0296843 | A1* | 12/2007 | Kasuga | H01L 27/1462 |
| | | | | 348/294 |
| 2010/0238330 | A1 | 9/2010 | Hirota | |
| 2010/0314667 | A1 | 12/2010 | Nozaki et al. | |
| 2011/0141333 | A1* | 6/2011 | Naruse | H01L 27/14621 |
| | | | | 348/308 |
| 2013/0134414 | A1 | 5/2013 | Yamazaki et al. | |
| 2014/0078366 | A1* | 3/2014 | Dokoutchaev | H04N 5/2254 |
| | | | | 348/302 |
| 2014/0291481 | A1* | 10/2014 | Zhang | H04N 5/361 |
| | | | | 250/208.1 |
| 2015/0219809 | A1* | 8/2015 | Ruhnau | H04N 5/35563 |
| | | | | 348/360 |

OTHER PUBLICATIONS

U.S. Appl. No. 14/743,385, filed Jun. 18, 2015, Dajiang Yang et al.
"Bayer filter," Wikipedia, the free encyclopedia, pp. 1-6, retrieved Jun. 18, 2015 from: https://en.wikipedia.org/wiki/Bayer_filter.
U.S. Appl. No. 14/743,385—Non-Final Office Action, dated Jul. 29, 2016, 15 pages.

* cited by examiner

HIGH DYNAMIC RANGE IMAGE SENSOR WITH VIRTUAL HIGH-LOW SENSITIVITY PIXELS

CROSS-REFERENCE TO RELATED APPLICATION(S)

This application is related to unpublished co-pending U.S. application Ser. No. 14/743,385, filed Jun. 18, 2015, entitled "Virtual High Dynamic Range Large-Small Pixel Image Sensor," and assigned to the Assignee of the present application.

BACKGROUND INFORMATION

Field of the Disclosure

The present invention relates generally to imaging, and more specifically, the present invention is directed to high dynamic range image sensors.

Background

Image sensors have become ubiquitous. They are widely used in digital still cameras, cellular phones, security cameras, as well as, medical, automobile, and other applications. The technology used to manufacture image sensors, such as for example complementary metal-oxide-semiconductor (CMOS) image sensors (CIS), has continued to advance at a great pace. For example, the demands for higher resolution and lower power consumption have encouraged the further miniaturization and integration of these image sensors.

High dynamic range (HDR) image sensors have become useful for many applications. In general, ordinary image sensors, including for example charge coupled device (CCD) and CMOS image sensors, have a dynamic range of approximately 70 dB dynamic range. In comparison, the human eye has a dynamic range of up to approximately 100 dB. There are a variety of situations in which an image sensor having an increased dynamic range is beneficial. For example, image sensors having a dynamic range of more than 100 dB dynamic range are needed in the automotive industry in order to handle different driving conditions, such as driving from a dark tunnel into bright sunlight. Indeed, many applications may require image sensors with at least 90 dB of dynamic range or more to accommodate a wide range of lighting situations, varying from low light conditions to bright light conditions.

One of the challenges with modern high dynamic range image sensors that use dual pixels having large and small photodiodes is the process complexity that is involved in order to provide the different semiconductor process conditions needed in order to fabricate the large photodiodes and the small photodiodes. In addition, there is asymmetric blooming, crosstalk, and noise associated with the large photodiodes and the small photodiodes, which result in unbalanced high dynamic range imaging. Furthermore, the small photodiodes have limited full well capacity compared to the large photodiodes, which limit the extension of the high light dynamic range.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
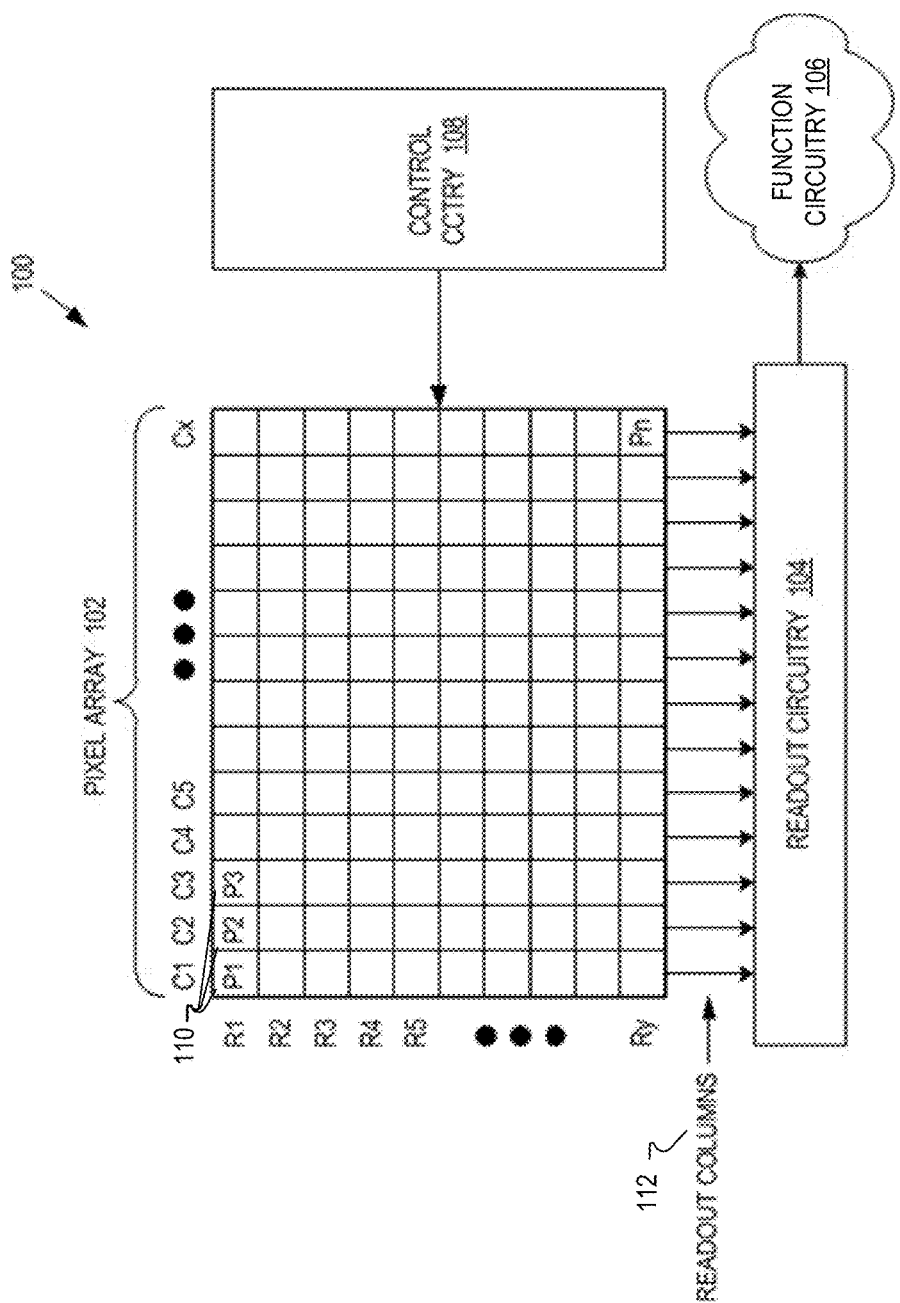
FIG. 1 is a diagram illustrating one example of an imaging system including an example HDR image sensor with virtual high and low sensitivity photodetectors in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Examples in accordance with the teaching of the present invention describe a high dynamic range (HDR) image sensor with virtual high and low sensitivity photodetectors that are arranged into virtual high-low sensitivity groupings (e.g., pairs). Each virtual high-low sensitivity grouping includes a first photodetector and a second photodetector. The virtual low sensitivity photodetector is provided by having an attenuator disposed along the optical path of incident light to the photodetector, whereas the virtual high sensitivity photodetector is provided by having no attenuator (i.e., an absence of an attenuator) along the optical path of incident light to the photodetector. Both of the first and second photodetectors of each virtual high-low sensitivity grouping are disposed in semiconductor material, are identically sized, and are fabricated with identical semiconductor processing conditions in accordance with the teachings of the present invention.

With both of the photodetectors of each virtual high-low sensitivity grouping having the same size, processing is simplified since the same semiconductor fabrication process conditions can be used when fabricating both of the photodetectors of the virtual high-low sensitivity grouping. In addition, geometrical symmetry can be realized between the photodetectors, which can result in fewer fabrication process steps, and increased symmetry for electrical and optical performance, and therefore provide improved performance with respect to blooming, crosstalk, photoresponse nonuniformity (PRNU), and the like. In various examples, the photodetectors may be provided with photodiodes, or with single photon avalanche diodes (SPADs). In an example in which the photodetectors are provided with photodiodes, the photodiode of the virtual low sensitivity photodetector has a full well capacity substantially equal to the full well capacity of the photodiode of the virtual high sensitivity photodetector, which therefore provides improved high light dynamic range for the photodiode of the virtual low sensitivity photodetector.

To illustrate, FIG. 1 is a diagram that shows generally one example of an HDR image sensor with virtual high and low sensitivity photodetectors included in image sensing system 100 in accordance with the teachings of the present invention. As shown in the depicted example, image sensing system 100 includes an HDR image sensor having example pixel array 102 with HDR pixels 110 in accordance with the teachings of the present invention. In one example, each of the HDR pixels 110 includes a first photodetector to provide a virtual low sensitivity photodetector, and a second photodetector to provide a virtual high sensitivity photodetector.

The virtual low and high sensitivity photodetectors are arranged into virtual high-low sensitivity groupings. As will be shown, the photodetectors in the virtual high-low sensitivity groupings are identically sized and are fabricated in semiconductor material with identical semiconductor processing conditions, but in effect provide different high and low light sensitivities in accordance with the teachings of the present invention.

As shown in the depicted example, image sensing system 100 includes pixel array 102 coupled to control circuitry 108, and readout circuitry 104, which is coupled to function circuitry 106. Pixel pixel array 102 is a two-dimensional (2D) array of imaging sensors or HDR pixels 110 (e.g., pixels P1, P2 . . . , Pn). In one example, each HDR pixel 110 includes a virtual high-low sensitivity grouping that includes a first photodetector providing a virtual low sensitivity photodetector, and second photodetectors providing a virtual high sensitivity photodetector. As illustrated, each HDR pixel 110 is arranged into a row (e.g., rows R1 to Ry) and a column (e.g., column C1 to Cx) to acquire image data of a person, place, object, etc., which can then be used to render an image of the person, place, object, etc.

In one example, after each HDR pixel 110 has acquired its image data or image charge, the image data is read out by readout circuitry 104 through readout columns 112 and then transferred to function circuitry 106. In various examples, readout circuitry 104 may include amplification circuitry, analog-to-digital (ADC) conversion circuitry, or otherwise. Function circuitry 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
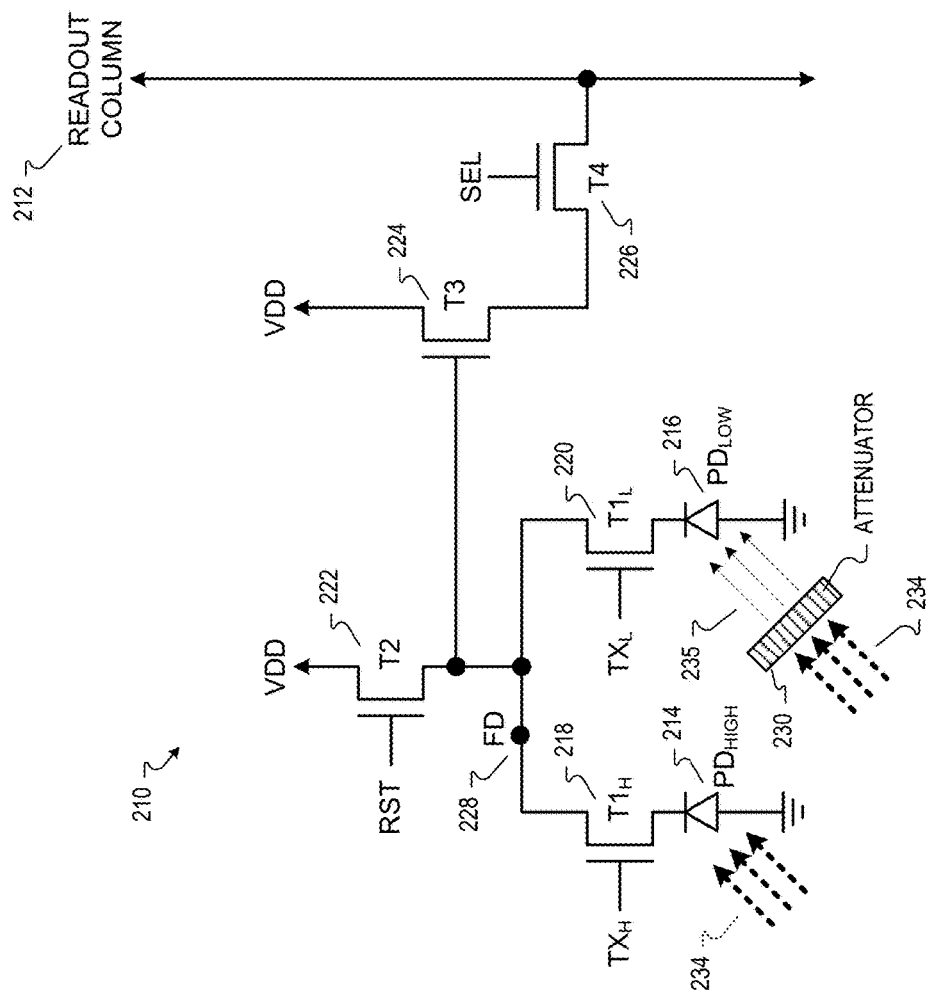
FIG. 2 is a schematic illustrating one example of HDR pixel circuitry of an image sensor including an example HDR image sensor with virtual high and low sensitivity photodetectors utilizing photodiodes in accordance with the teachings of the present invention.

FIG. 2 is a schematic illustrating one example of an HDR pixel 210 of an image sensor including an example HDR image sensor with virtual high and low sensitivity photodetectors in accordance with the teachings of the present invention. In one example, it is appreciated that HDR pixel 210 may be one of the plurality of HDR pixels 110 included in an image sensor with the example pixel array 102 of the image sensing system 100 illustrated above in FIG. 1. It is appreciated that HDR pixel 210 is provided for explanation purposes and therefore represents just one possible architecture for implementing each pixel within pixel array 102 of FIG. 1, and that examples in accordance with the teachings of the present invention are not limited to specific pixel architectures. Indeed, one of ordinary skill in the art having the benefit of the instant disclosure will understand that the present teachings are applicable to 3T, 4T, 5T designs, as well as various other suitable pixel architectures, such as SPAD architectures, or the like, in accordance with the teachings of the present invention.

As shown in the example depicted in FIG. 2, HDR pixel 210 includes a virtual high-low sensitivity grouping, which includes a virtual high sensitivity photodetector, illustrated as photodetector $PD_{HIGH}$ 214, and a virtual low sensitivity photodetector, illustrated as photodetector $PD_{LOW}$ 216. In the illustrated example, photodetector $PD_{HIGH}$ 214 is coupled to a floating diffusion FD 228 through a transfer transistor $T1_H$ 218, and photodetector $PD_{LOW}$ 216 is coupled to the floating diffusion FD 228 through a transfer transistor $T1_L$ 220. In one example, the photodetector $PD_{HIGH}$ 214 and the photodetector $PD_{LOW}$ 216 are implemented with photodiodes that are identically sized and are symmetrically fabricated using identical semiconductor processing conditions.

As shown, photodetector $PD_{HIGH}$ 214 is illuminated with incident light 234 to generate image charge. However, an attenuator 230 is included along the optical path of the incident light 234 to photodetector $PD_{LOW}$ 216 such that photodetector $PD_{LOW}$ 216 is illuminated with the attenuated incident light 235 from attenuator 230 to generate image charge. There is no attenuator along the optical path of the incident light 234 to the photodetector $PD_{HIGH}$ 214. As such, a virtual high sensitivity photodetector is provided with photodetector $PD_{HIGH}$ 214, and a virtual low sensitivity photodetector is provided with photodetector $PD_{LOW}$ 216 to provide an HDR pixel 210 in accordance with the teachings of the present invention. In one example, attenuator 230 is made of a semi-transparent material that has a transmittance of less than 100%. For instance, in one example, the semi-transparent material of attenuator 230 is a solid layer of grey material (i.e., solid layer of semi-transparent material having no gaps or openings) that has a transmittance of 10%-20%, depending on the HDR needs. The transmittance of attenuator 230 can be tuned to control the light sensitivity of the virtual low sensitivity photodetector provided with photodetector $PD_{LOW}$ 216 in accordance with the teachings of the present invention. Since attenuator 230 is disposed only in front of photodetector $PD_{LOW}$ 216, and not in front of photodetector $PD_{HIGH}$ 214, the virtual low sensitivity and virtual high sensitivity photodetectors that are provided by photodetector $PD_{HIGH}$ 214 and photodetector $PD_{LOW}$ 216 have different effective sensitivities to incident light 234. By utilizing both virtual low sensitivity and virtual high sensitivity photodetectors in HDR pixel 210, HDR imaging sensing is realized in accordance with the teachings of the present invention.

Continuing with example depicted in FIG. 2, image charge is photogenerated in photodetector $PD_{HIGH}$ 214 in response to incident light 234, and in photodetector $PD_{LOW}$ 216 in response to the attenuated incident light 235. The image charge that is accumulated in photodetector $PD_{HIGH}$ 214 is switched through transfer transistor $T1_H$ 218 to floating drain FD 228 in response to a control signal $TX_H$, and the image charge that is accumulated in photodetector $PD_{LOW}$ 216 is switched through transfer transistor $T1_L$ 220 to floating drain FD 228 in response to a control signal $TX_L$.

As shown in the example, HDR pixel 210 also includes an amplifier transistor T3 224 that has a gate terminal coupled to floating drain FD 228. Thus, in the illustrated example, the respective image charges from photodetector $PD_{HIGH}$ 214 and photodetector $PD_{LOW}$ 216 are separately switched to floating drain FD 228, which is coupled to amplifier transistor T3 224. In one example, amplifier transistor T3 224 is coupled in a source follower configuration as shown, which therefore amplifies an input signal at the gate terminal of amplifier transistor T3 224 to an output signal at the source terminal of amplifier transistor T3 224. As shown, row select transistor T4 226 is coupled to the source terminal of amplifier transistor T3 224 to selectively switch the output of amplifier transistor T3 231 to readout column 212 in response to a control signal SEL. As shown in the example, HDR pixel 210 also includes reset transistor T2 222 coupled to reset floating drain FD 228, as well as to photodetector $PD_{HIGH}$ 214 and photodetector $PD_{LOW}$ 216 (through transistors $T1_H$ 218 and $T1_L$ 220), and may be used to reset charge accumulated in HDR pixel 210 in response to a reset signal RST. In one example, the charge accumulated in floating drain FD 228, photodetector $PD_{HIGH}$ 214, and photodetector $PD_{LOW}$ 216 can be reset during an initialization period of HDR pixel 210, or for example each time after charge information has been read out from HDR pixel 210 prior to accumulating charge in photodetector $PD_{HIGH}$ 214 and photodetector $PD_{HIGH}$ 214 for the acquisition of a new HDR image in accordance with the teachings of the present invention.

Figure 3:
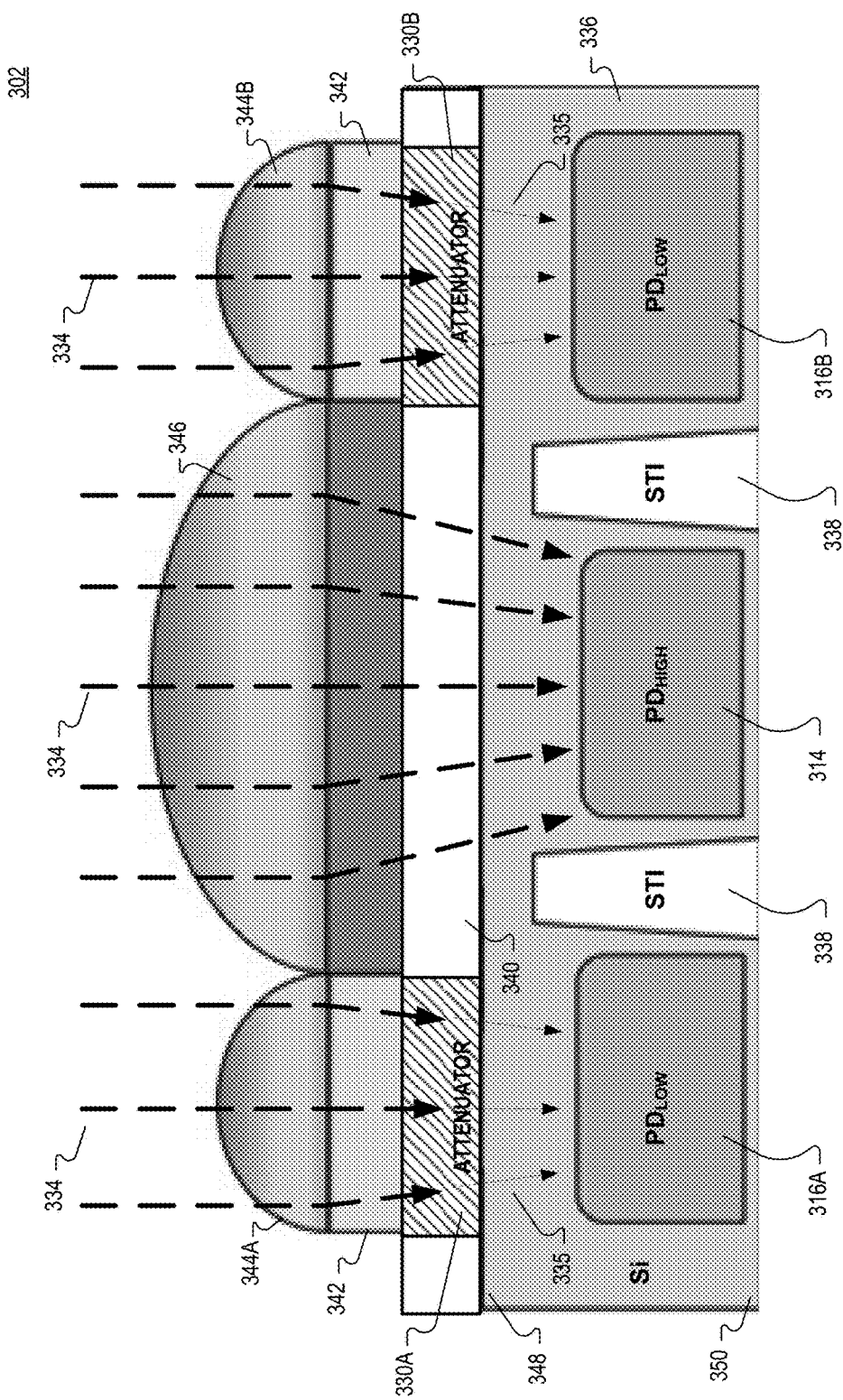
FIG. 3 illustrates a cross-section view of a portion of an example pixel array included in an example HDR image sensor with virtual high and low sensitivity photodetectors utilizing photodiodes in accordance with the teachings of the present invention.

FIG. 3 illustrates a cross-section view of a portion of an example pixel array 302 included in an example HDR image sensor with virtual high and low sensitivity photodetectors utilizing photodiodes in accordance with the teachings of the present invention. It is appreciated that the portion of example pixel array 302 illustrated in FIG. 3 may be one example of a portion of an implementation of pixel array 102 of the image sensor including an example HDR image sensor with virtual high and low sensitivity photodetectors as shown in FIG. 1, including for example the photodetector $PD_{HIGH}$ 214 and photodetector $PD_{LOW}$ 216 shown in FIG. 2, and that similarly named and numbered elements referenced below are coupled and function similar to as described above.

As shown in the depicted cross-section, pixel array 302 includes a plurality of photodetectors disposed in semiconductor material 336. In the depicted example shown in FIG. 3, the photodetectors are implemented using a photodiode $PD_{HIGH}$ 314, and photodiodes $PD_{LOW}$ 316A and 316B, which are disposed in semiconductor material 336. In the example, photodiode $PD_{HIGH}$ 314 is utilized to provide a virtual high sensitivity photodiode, and photodiodes $PD_{LOW}$ 316A and 316B are utilized to provide virtual low sensitivity photodiodes in accordance with the teachings of the present invention. In one example, semiconductor material 336 may include silicon (Si), or another suitable semiconductor material. In one example, photodiode $PD_{HIGH}$ 314, and photodiodes $PD_{LOW}$ 316A and 316B are disposed proximate to a front side 360 of semiconductor material 336. Although not shown in FIG. 3, the pixel support circuitry of pixel array 302 (including for example the transistors, diffusions, etc., described for example in FIG. 2) is also disposed proximate to front side 360. In the example shown in FIG. 3, each of the photodiodes $PD_{HIGH}$ 314, $PD_{LOW}$ 316A and 316B share the same fabrication process conditions, same size, same full well capacity, and symmetry in design. In one example, each of the plurality of photodiodes is separated in the semiconductor material 336 by shallow trench isolation (STI) structures 338.

As shown in the depicted example, incident light 334 that is directed through a back side 348 of semiconductor material 336 as shown. In the depicted example, a transparent oxide layer 340 is disposed over the back side 348 of semiconductor material 336, with a color filter array 342 is disposed over the oxide layer 340, and an array of microlenses disposed over the color filter array 342. In the example, attenuators 330A and 330B are disposed along the optical path of incident light 334 towards the photodiodes $PD_{LOW}$ 316A and 316B, which therefore cause photodiodes $PD_{LOW}$ 316A and 316B to receive instead attenuated light 335 through back side 348 of semiconductor material 336. In comparison, non-attenuated incident light 334 is directed into photodiode $PD_{HIGH}$ 314 through transparent oxide layer 340, and through back side 348 of semiconductor material 336, because there is no attenuator along the optical path of incident light 334 to the photodetector $PD_{HIGH}$ 314 through back side 348 of semiconductor material 336.

In one example, color filter array 342 includes a mosaic of color filters, each of which is disposed over a respective photodiode of the pixel array 302 as shown to capture color information. Similarly, the array of microlenses includes a plurality of microlenses, each of which is disposed over a respective photodiode $PD_{HIGH}$ 314, $PD_{LOW}$ 316A and 316B of the pixel array 302 as shown to direct light to a respective photodiode of the pixel array 302.

Thus, as shown in the depicted example, incident light 334 is directed through a microlens 344A of the array of microlenses, and through a respective color filter of color filter array 342. In the example, a plurality of attenuators, including attenuators 330A and 330B are disposed proximate to the back side 348 of the semiconductor material 336 between the plurality of microlenses and the plurality of photodiodes in the semiconductor material 336. As such, the incident light 334 directed through microlens 344A and through color filter array 342 is received by attenuator 330A. Attenuated light 335 is then directed from attenuator 330A through back side 348 of semiconductor material 336 to photodiode $PD_{LOW}$ 316A. Incident light 334 is directed through a microlens 346 of the array of microlenses, through a respective color filter of color filter array 342, through transparent oxide layer 340, through back side 348 of semiconductor material 336 to photodiode $PD_{HIGH}$ 314. Similarly, incident light 334 is directed through a microlens 344B of the array of microlenses, through a respective color filter of color filter array 342 to attenuator 330A. Attenuated light 335 is then directed from attenuator 330B through back side 348 of semiconductor material 336 to photodiode $PD_{LOW}$ 316B.

In one example, attenuators 330A and 330B are made of a semi-transparent material that has a transmittance of less than 100%. For instance, in one example, the semi-transparent material of attenuators 330A and 330B is a solid layer of grey material (i.e., solid layer of transparent material having no gaps or openings) that has a transmittance of 10%-20%, depending on the HDR needs. The transmittance of attenuators 330A and 330B is tuned to control the light sensitivity of the virtual low sensitivity photodetector provided with photodiodes $PD_{LOW}$ 316A and 316B in accordance with the teachings of the present invention. Although not shown in FIG. 3, in another example, it is appreciated that attenuators 330A and 330B may also be covered with the transparent oxide layer 340 between the color filter layer 342 and the attenuators 330A and 330B.

Therefore, since photodiodes $PD_{LOW}$ 316A and 316B receive attenuated incident light 335 instead of non-attenuated incident light 334, and since the photodiodes $PD_{LOW}$ 316A and 316B have the same full well capacity as photodiode $PD_{HIGH}$ 314, it is appreciated that the photodiodes $PD_{LOW}$ 316A and $PD_{LOW}$ 316B have lower light sensitivity with increased high light dynamic range when compared to comparable smaller photodiodes having smaller full well capacities, while photodiode $PD_{HIGH}$ 314 has high light sensitivity in accordance with the teachings of the present invention.

Figure 4A:
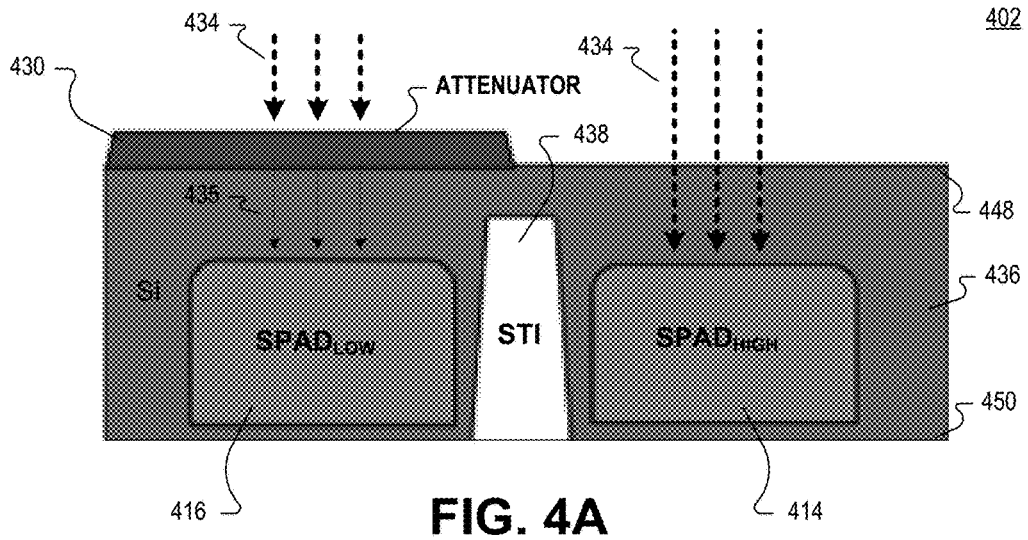
FIG. 4A illustrates a cross-section view of a portion of an example HDR image sensor with virtual high and low sensitivity photodetectors utilizing single photon avalanche diodes (SPADs) in accordance with the teachings of the present invention.

FIG. 4A illustrates a cross-section view of a portion of an example pixel array 402 included in an example HDR image sensor with virtual high and low sensitivity photodetectors utilizing single photon avalanche diodes (SPADs) in accordance with the teachings of the present invention. It is appreciated that the portion of example pixel array 402 illustrated in FIG. 4A may be one example of a portion of an implementation of pixel array 102 of the image sensor including an example HDR image sensor with virtual high and low sensitivity photodetectors as shown in FIG. 1, and that similarly named and numbered elements referenced below are coupled and function similar to as described above.

As shown in the depicted cross-section, pixel array 402 includes a plurality of photodetectors disposed in semiconductor material 436. In the depicted example shown in FIG. 4A, the photodetectors are implemented using SPADs, which are labeled $SPAD_{HIGH}$ 416 and $SPAD_{LOW}$ 414, and are disposed in semiconductor material 436. In the example, $SPAD_{HIGH}$ 414 is utilized to provide a virtual high sensitivity photodetector, and $SPAD_{LOW}$ 416 is utilized to provide virtual low sensitivity photodetector in accordance with the teachings of the present invention. In one example, semiconductor material 436 may include silicon (Si), or another suitable semiconductor material. In one example, $SPAD_{HIGH}$ 416 and $SPAD_{LOW}$ 414 are disposed proximate to a front side 460 of semiconductor material 436, and share the same fabrication process conditions, same size, and symmetry in design. In the depicted example, each of the SPADs is separated in the semiconductor material 436 by shallow trench isolation (STI) structure(s) 438.

As shown in the depicted example, incident light 434 is directed through a back side 448 of semiconductor material 436 to $SPAD_{HIGH}$ 416 and $SPAD_{LOW}$ 414. Although not shown in FIG. 4A, in one example, a transparent oxide layer may be disposed over the back side 448 of semiconductor material 436, with a color filter array disposed over the oxide layer, and an array of microlenses disposed over the color filter array. In the example shown in FIG. 4A, an attenuator 430 is disposed along the optical path of incident light 434 towards the $SPAD_{LOW}$ 416, which therefore causes $SPAD_{LOW}$ 416 to receive attenuated light 435 through back side 448 of semiconductor material 436. In comparison, non-attenuated incident light 434 is directed into $SPAD_{HIGH}$ 414 through back side 448 of semiconductor material 436, because there is no attenuator along the optical path of incident light 434 to $SPAD_{HIGH}$ 414 through back side 448 of semiconductor material 436.

In one example, attenuator 430 is made of a semi-transparent material that has a transmittance of less than 100%. For instance, in one example, the semi-transparent material of attenuators attenuator 430 is a solid layer of grey material (i.e., solid layer of semi-transparent material having no gaps or openings) that has a transmittance of 10%-20%, depending on the HDR needs. The transmittance of attenuator 430 can be tuned to control the light sensitivity of the virtual low sensitivity photodetector provided with $SPAD_{LOW}$ 416 in accordance with the teachings of the present invention. Although not shown in FIG. 4A, in another example, it is appreciated that attenuator 430 may also be covered with a transparent oxide layer disposed over the back side 448 of semiconductor material 436.

It is appreciated that photodetectors implemented SPADs as shown in the example depicted in FIG. 4A are compatible with CMOS technology, which may also be used to provide other pixel support circuitry coupled to the SPADs. The utilization of SPADs may provide extremely high low light sensitivity as a single photon can cause an avalanche event in a SPAD.

Figure 4B:
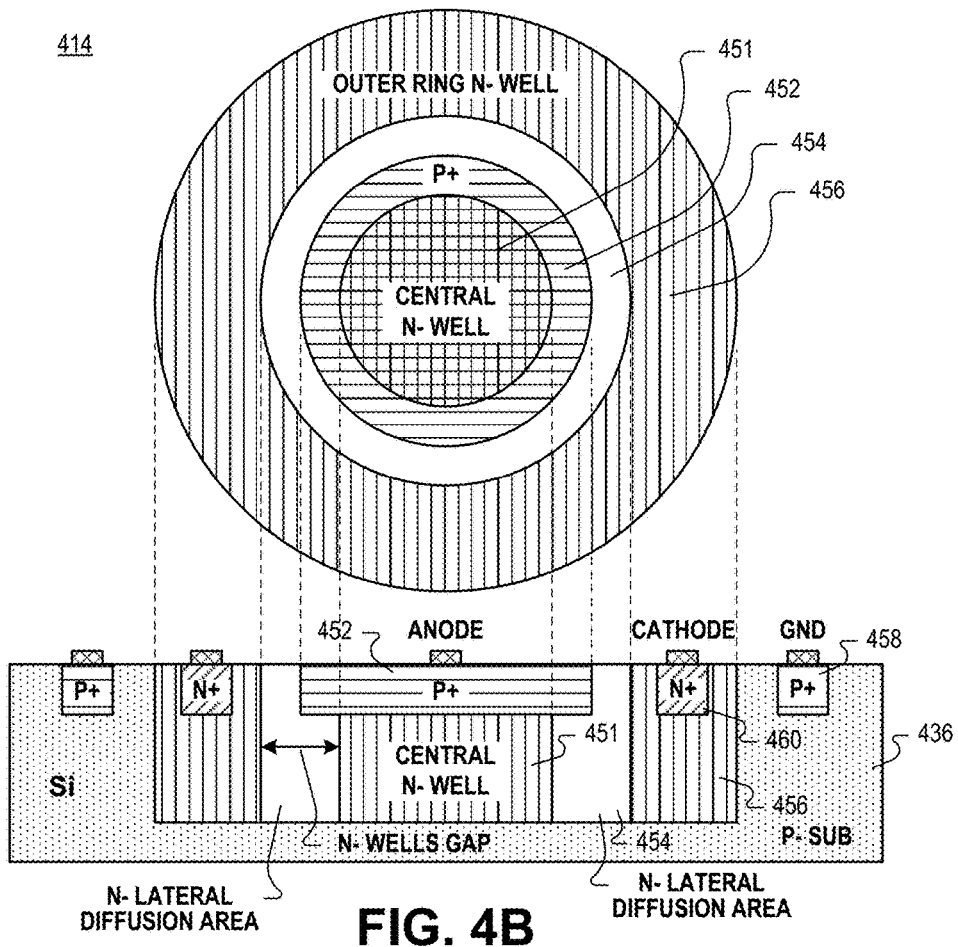
FIG. 4B illustrates an example showing increased detail of top and cross-section views of a single photon avalanche diode (SPAD) utilized in an example HDR image sensor with virtual high and low sensitivity photodetectors in accordance with the teachings of the present invention.

FIG. 4B illustrates an example showing increased detail of top and cross-section views of a SPAD 414 utilized in an example HDR image sensor with virtual high and low sensitivity photodetectors in accordance with the teachings of the present invention. It is appreciated that SPAD 414 illustrated in FIG. 4B may be one example of SPAD 414 or SPAD 416 as shown in FIG. 4A, and that similarly named and numbered elements referenced below are coupled and function similar to as described above.

As shown in the example depicted in FIG. 4B, SPAD 414 includes a central n– well 451 disposed in semiconductor material 436. In one example, semiconductor material 436 may include a p– substrate comprised of silicon (Si), or another suitable semiconductor material. Central n– well 451 is laterally surrounded in the semiconductor material 436 by an n– lateral diffusion 454, which is laterally surrounded in the semiconductor material 436 by an outer ring n– well 456. A p+ doped region 452 is disposed over the central n– well 451, and an inner portion of the n– lateral diffusion area 454 as shown. A multiplication junction is defined in SPAD 414 at the interface between p+ doped region 452 and central n– well 451.

In the depicted example, an anode terminal of SPAD 414 is defined in the p+ doped region 452, and a cathode terminal is defined in the outer ring n– well 456. In the example, an n+ region 460 is defined in the outer ring n– well 456 to provide electrical contact to the cathode terminal. In the example, a p+ region 458 is defined in the p– substrate of semiconductor material 436 to provide a ground terminal for SPAD 414.

In operation, it is appreciated that the multiplication junction defined at the interface between p+ doped region 452 and central n– well 451 is reversed biased above a breakdown voltage such that a photon directed into the SPAD 414 triggers an avalanche multiplication process in the multiplication junction, thereby causing a single photo-generated carrier triggering an avalanche multiplication process, which causes a current at an output of the SPAD 414 to reach its final value quickly. This avalanche current continues until a quenching element (not shown) coupled to SPAD 414 is used to quench the avalanche process by reducing the bias voltage.

Figure 5B:
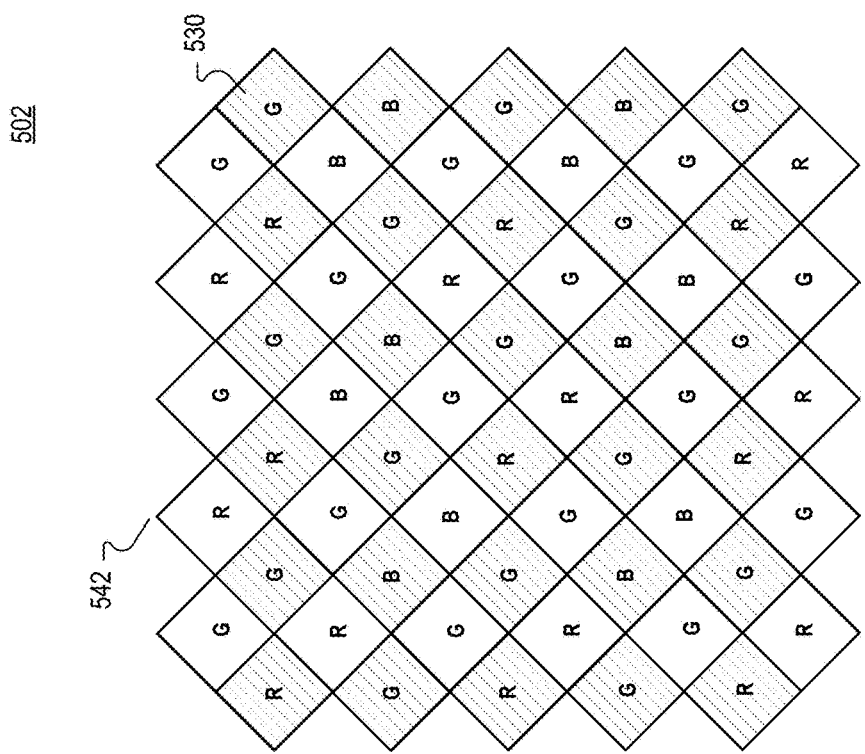
FIG. 5B illustrates a top down view of an example color filter array arranged over a portion of a pixel array of an example HDR image sensor with virtual high and low sensitivity photodetectors in accordance with the teachings of the present invention.
Figure 5A:
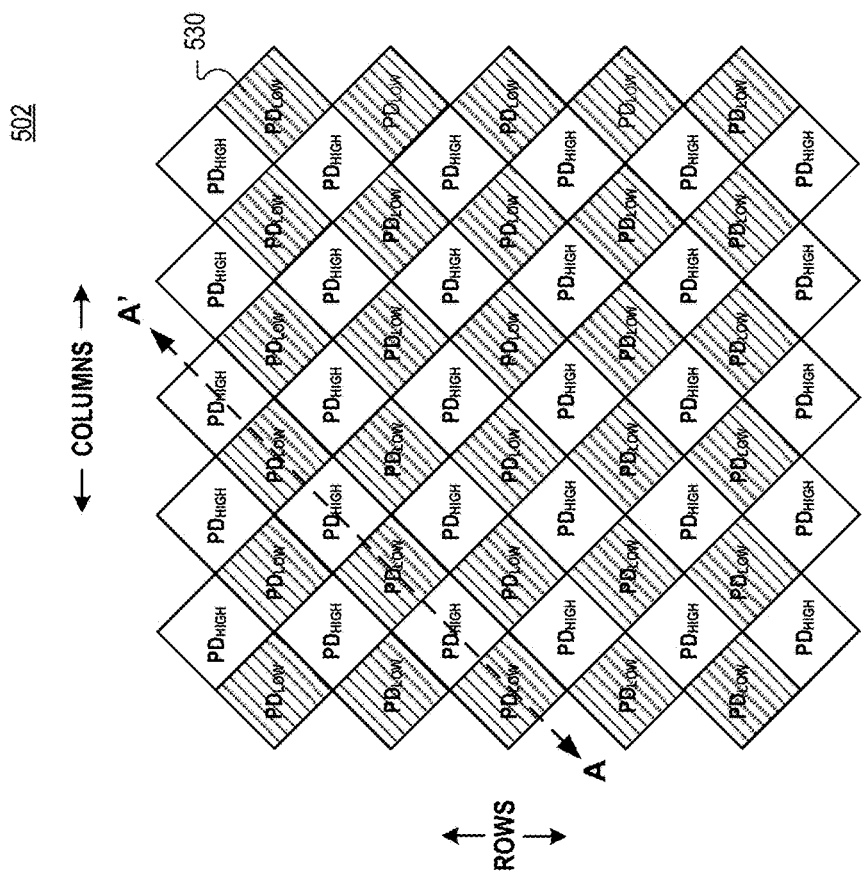
FIG. 5A illustrates a top down view of a portion of a pixel array of an example HDR image sensor with virtual high and low sensitivity photodetectors in accordance with the teachings of the present invention.

FIG. 5A illustrates a top down view of a portion of a pixel array 502 of an example HDR image sensor with virtual high and low sensitivity photodetectors in accordance with the teachings of the present invention. It is noted that the portion of example pixel array 502 illustrated in FIG. 5A may be a top down view of a one example of a portion of an implementation of pixel array 102 of the image sensing system 100 illustrated above in FIG. 1, including for example the photodetector $PD_{HIGH}$ 214 and photodetector $PD_{LOW}$ 216 shown in FIG. 2, or photodetector $PD_{HIGH}$ 314 and photodetectors $PD_{LOW}$ 316A and $PD_{LOW}$ 316B shown in FIG. 3, or $SPAD_{HIGH}$ 414 and $SPAD_{LOW}$ 416 shown in FIGS. 4A-4B, and that similarly named and numbered elements referenced below are coupled and function similar to as described above. It is also appreciated that the cross-section example pixel array 302 illustrated in FIG. 3, or the cross-section example pixel array 402 illustrated in FIG. 4A may be a cross-section along dashed line A-A' of pixel array 502 of FIG. 5A.

As shown in the example depicted in FIG. 5A, pixel array 502 includes a plurality of virtual high and low sensitivity photodetectors $PD_{LOW}$ and $PD_{HIGH}$ that are arranged into virtual high-low sensitivity groupings (e.g., pairs). Each virtual high-low sensitivity grouping includes a first photodetector and a second photodetector (e.g., $PD_{LOW}$ and $PD_{HIGH}$, or $SPAD_{LOW}$ and $SPAD_{HIGH}$). Each virtual low sensitivity photodetector is provided by having an attenuator 530 disposed along the optical path of incident light to the photodetector, whereas the virtual high sensitivity photodetector is provided by having no attenuator (i.e., an absence of an attenuator 530) along the optical path of incident light to the photodetector. Accordingly, it is appreciated that in the depicted example, the ratio of the total number of attenuators 530 to the combined total number of virtual low sensitivity detectors and virtual high sensitivity photodetectors (e.g., number of $PD_{LOW}$+number of $PD_{HIGH}$) in pixel array 502 is 1:2. Both of the first and second photodetectors of each virtual high-low sensitivity grouping are disposed in semiconductor material, are identically sized, and are fabricated with identical semiconductor processing conditions.

Furthermore, as illustrated in the depicted example, each virtual low sensitivity photodetector $PD_{LOW}$ and its corresponding virtual high sensitivity photodetector $PD_{HIGH}$ in a virtual high-low sensitivity grouping is arranged in the semiconductor material in adjacent columns and rows of pixel array 502 as shown. In other words, each respective virtual low sensitivity photodetector $PD_{LOW}$ and its corresponding virtual high sensitivity photodetector $PD_{HIGH}$ of the virtual high-low sensitivity groupings are adjacent to each other and arranged along a diagonal in pixel array 502 as shown in the example of FIG. 5A.

FIG. 5B illustrates a top down view of an example color filter array 542 arranged over a portion of a pixel array 502 as illustrated in FIG. 5A. As shown in the example, color filter array 542 includes a mosaic of color filters, each of which is disposed over a respective photodetector of the pixel array 502 as shown to capture color information. In the example, the color filter array 542 includes red (R), blue (B), and green (G) color filters. It is noted that the example depicted in FIG. 5B depicts a color filter array 542 in which the filter itself is depicted as being rotated 45 degrees. However, it is noted that each pair (i.e., each virtual high-low sensitivity grouping along a diagonal) of virtual high sensitivity photodetectors $PD_{HIGH}$ and virtual low sensitivity photodetector $PD_{LOW}$ in pixel array 502 has the same color filter over them.

Accordingly, as shown in the example depicted in FIG. 5B, for each virtual high sensitivity photodetectors $PD_{HIGH}$ in pixel array 502 that has a red (R) color filter, the corresponding adjacent virtual low sensitivity photodetector $PD_{LOW}$ of that pair also has a red (R) color filter. For each virtual high sensitivity photodetectors $PD_{HIGH}$ in pixel array 502 that has a green (G) color filter, the corresponding adjacent virtual low sensitivity photodetector $PD_{LOW}$ of that pair also has a green (G) color filter. Similarly, for each virtual high sensitivity photodetectors $PD_{HIGH}$ in pixel array 502 that has a blue (B) color filter, the corresponding adjacent virtual low sensitivity photodetector $PD_{LOW}$ of that pair also has a blue (B) color filter.

Thus, unlike a conventional Bayer color filter design, the example color filter array 542 illustrates in FIG. 5B shows that there are always two adjacent photodetectors (i.e., $PD_{HIGH}$ and $PD_{LOW}$ of a virtual high-low sensitivity grouping) detecting the same color. One reason for this type of color array is to contribute to pixel "binning," where two adjacent photodetectors can be merged, making the sensor itself more "sensitive" to light. Another reason is for the sensor to record two different exposures, which is then merged to produce an image with greater dynamic range. In one example, the underlying circuitry has two read-out channels that take their information from alternate rows of the sensor. The result is that it can act like two interleaved sensors, with different exposure times for each half of the photosites. Half of the photosites can be intentionally underexposed so that they fully capture the brighter areas of the scene. This retained highlight information can then be blended in with the output from the other half of the sensor that is recording a "full" exposure, again making use of the close spacing of similarly colored photodiodes in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
   a plurality of photodetectors arranged in semiconductor material, wherein each one of the plurality of photodetectors is identically sized and is fabricated in the semiconductor material with identical semiconductor processing conditions, wherein the plurality of photodetectors are organized into virtual high-low sensitivity groupings including a first photodetector and a second photodetector;
   an array of microlenses disposed over the semiconductor material, wherein each one of the microlenses is disposed over a respective one of the photodetectors, wherein a first microlens of the array of microlenses is disposed over the first photodetector, and wherein a second microlens of the array of microlenses is disposed over the second photodetector;
   a plurality of attenuators disposed over the semiconductor material, wherein each one of the plurality of attenuators has a same uniform thickness and comprises a solid layer of grey material that is a semi-transparent material having no gaps or openings that has a transmittance of 10%-20%, wherein each one of the plurality of attenuators is disposed along a first optical path between the first microlens and the first photodetector of each virtual high-low sensitivity grouping such that all incident light directed into the first photodetector is directed through a respective one of the plurality of attenuators, wherein there is an absence of one of the plurality of attenuators along a second optical path between the second microlens and the second photodetector of each virtual high-low sensitivity grouping such that all the incident light directed into the second photodetector is not directed through one of the plurality of attenuators; and
   a color filter array disposed over the semiconductor material between the array of microlenses and the plurality of photodetectors in the semiconductor material, wherein the color filter array includes a plurality of color filters.

2. The image sensor of claim 1, wherein the first and second photodetectors comprise photodiodes disposed in the semiconductor material.

3. The image sensor of claim 2 wherein a full well capacity of the first photodetector is substantially equal to a full well capacity of the second photodetector.

4. The image sensor of claim 1, wherein the first and second photodetectors comprise single photon avalanche diodes disposed in the semiconductor material.

5. The image sensor of claim 1, wherein the plurality of photodetectors is disposed proximate to a front side of the semiconductor material, wherein the plurality of attenuators are disposed proximate to a back side of the semiconductor material, and wherein the incident light is directed through the back side of the semiconductor material to the plurality of photodetectors.

6. The image sensor of claim 1, further comprising a transparent oxide layer disposed over the semiconductor material, wherein the incident light directed into the second photodetector along the second optical path is directed through the transparent oxide layer.

7. The image sensor of claim 1, wherein the first photodetector of each virtual high-low sensitivity grouping is a virtual low sensitivity photodetector of a high dynamic range pixel of the image sensor, and wherein the second photodetector of each virtual high-low sensitivity grouping is a virtual high light sensitivity photodetector of the high dynamic range pixel of the image sensor.

8. The image sensor of claim 1, wherein the first photodetector and the second photodetector of each virtual high-low sensitivity grouping are adjacent in the semiconductor material of a pixel array.

9. The image sensor of claim 1, wherein a first one of the plurality of color filters is disposed over the first photodetector, and a second one of the plurality of color filters is disposed over the second photodetector, wherein the first and second color filters are both the same color.

10. An imaging system, comprising:
    a pixel array including a plurality of photodetectors arranged in semiconductor material, wherein each one of the plurality of photodetectors is identically sized and is fabricated in the semiconductor material with identical semiconductor processing conditions, wherein the plurality of photodetectors are organized into virtual high-low sensitivity groupings including a first photodetector and a second photodetector;
    an array of microlenses disposed over the semiconductor material, wherein each one of the microlenses is disposed over a respective one of the photodetectors, wherein a first microlens of the array of microlenses is disposed over the first photodetector, and wherein a second microlens of the array of microlenses is disposed over the second photodetector;
    a plurality of attenuators disposed over the semiconductor material, wherein each one of the plurality of attenuators has a same uniform thickness and comprises a solid layer of grey material that is a semi-transparent material having no gaps or openings that has a transmittance of 10%-20%, wherein each one of the plurality of attenuators is disposed along a first optical path between the first microlens and the first photodetector of each virtual high-low sensitivity grouping such that all incident light directed into the first photodetector is directed through a respective one of the plurality of attenuators, wherein there is an absence of the plurality of attenuators along a second optical path between the second microlens and the second photodetector of each virtual high-low sensitivity grouping such that all the incident light directed into the second photodetector is not directed through one of the plurality of attenuators;

a color filter array disposed over the semiconductor material between the array of microlenses and the plurality of photodetectors in the semiconductor material, wherein the color filter array includes a plurality of color filters;

control circuitry coupled to the pixel array to control operation of the pixel array; and readout circuitry coupled to the pixel array to readout image data from the pixel array.

11. The imaging system of claim 10, further comprising function circuitry coupled to the readout circuitry to store the image data readout from the pixel array.

12. The imaging system of claim 10, wherein the first and second photodetectors comprise photodiodes disposed in the semiconductor material.

13. The imaging system of claim 12, wherein a full well capacity of the first photodetector is substantially equal to a full well capacity of the second photodetector.

14. The imaging system of claim 10, wherein the first and second photodetectors comprise single photon avalanche diodes disposed in the semiconductor material.

15. The imaging system of claim 10, wherein the plurality of photodetectors is disposed proximate to a front side of the semiconductor material, wherein the plurality of attenuators are disposed proximate to a back side of the semiconductor material, and wherein the incident light is directed through the back side of the semiconductor material to the plurality of photodetectors.

16. The imaging system of claim 10, wherein a first one of the plurality of color filters is disposed over the first photodetector, and a second one of the plurality of color filters is disposed over the second photodetector, wherein the first and second color filters are both the same color.

* * * * *